United States Patent [19]

Hasebe et al.

[11] Patent Number: 5,579,213
[45] Date of Patent: Nov. 26, 1996

[54] ELECTRONIC COMPONENT WITH SOLDERING-LESS TERMINAL STRUCTURE

[75] Inventors: Hironobu Hasebe, Takaoka; Takashi Kanayama; Shinichi Kamata, both of Toyama-ken, all of Japan

[73] Assignee: Hokuriku Electric Industry Co., Ltd., Japan

[21] Appl. No.: 587,546

[22] Filed: Jan. 18, 1996

Related U.S. Application Data

[62] Division of Ser. No. 365,497, Dec. 28, 1994, Pat. No. 5,546,280.

[30] Foreign Application Priority Data

Dec. 28, 1993 [JP] Japan .................................. 5-336906
Dec. 21, 1994 [JP] Japan .................................. 6-318669

[51] Int. Cl.⁶ .............................................. H01R 9/00
[52] U.S. Cl. ........................ 361/823; 361/752; 174/50 R
[58] Field of Search ................................ 361/752, 796, 361/758, 815, 816, 823; 174/50 R

[56] References Cited

U.S. PATENT DOCUMENTS 4,471,339  9/1984  Fukada et al. .......................... 338/162
4,710,707  12/1987  Knowles et al. ...................... 324/158 F Primary Examiner—Leo P. Picard
Assistant Examiner—Y. Whang
Attorney, Agent, or Firm—Pearne, Gordon, McCoy & Granger

[57] ABSTRACT

A high-voltage variable resistor capable of electrically connecting a connection electrode on a circuit board and a terminal fitment to each other without using any conductive rubber or soldering. A terminal fitment which is electrically connected to a connection electrode on a circuit board without soldering is arranged between a front surface of the circuit board and an inner surface of an insulating casing. The terminal fitment is provided with a connection conductor holding section including a plurality of edges biting into an end of a connection conductor inserted into the insulating casing via each of through-holes of the insulating casing when a force in a direction of drawing the connection conductor out of the connection conductor holding section is applied to the connection conductor. The terminal fitment is integrally provided with a contact terminal section exhibiting elasticity. The contact terminal section has a contact pressed against the connection electrode on the circuit board by elasticity of the contact terminal section.

1 Claim, 6 Drawing Sheets

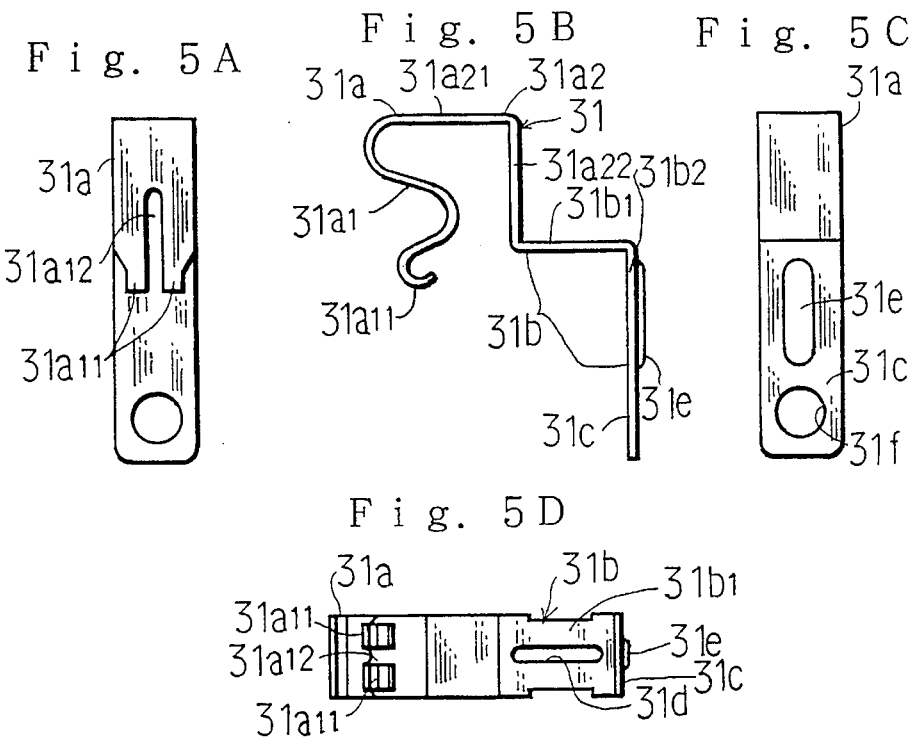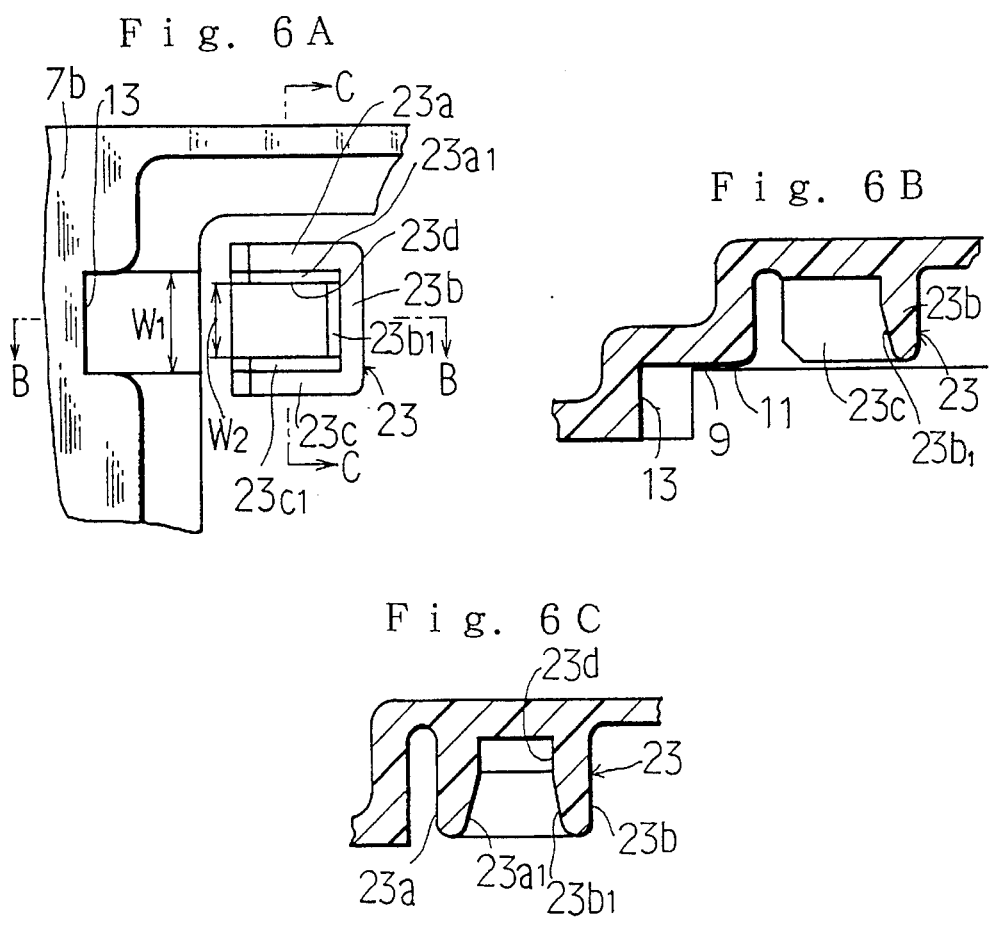

ELECTRONIC COMPONENT WITH SOLDERING-LESS TERMINAL STRUCTURE

This is a division of application Ser. No. 08/365,497, filed Dec. 28, 1994, now U.S. Pat. No. 5,546,280.

BACKGROUND OF THE INVENTION

This invention relates to an electronic component with a soldering-less terminal structure, and more particularly to an electronic component with a terminal connection structure which carries out connection without soldering.

Use of freon is subject to restriction in view of environmental pollution, so that it is highly required to connect a terminal conductor, a lead wire or the like to a connection electrode of a circuit board without soldering. This is likewise true of an electronic component called a focus pack used for adjusting a focus voltage of a cathode ray tube, a screen voltage thereof or the like.

U.S. Pat. No. 4,471,339 teaches a high-voltage variable resistor including a terminal connection structure for connecting, by means of a terminal fitment like a coiled spring provided at one end thereof with a ring into which a connection conductor or connection terminal is inserted, a connection electrode of the resistor to the connection terminal without soldering. Such a conventional terminal fitment as disclosed in the U.S. patent fails to firmly hold the connection terminal therein, to thereby cause the connection terminal to be easily released from the terminal fitment. Also, it tends to cause a failure in electrical connection to occur between the connection terminal and the terminal fitment. Further, the above-described construction of the terminal fitment requires to keep the connection terminal and connection electrode connected together prior to reception of a circuit board in an insulating casing. This, when a lead wire of an increased length is required for the connection conductor, causes the long lead wire to obstruct assembling of the high-voltage variable resistor. In particular, when the high-voltage variable resistor including the terminal connection structure is combined with a fly-back transformer, the high-voltage variable resistor must be placed in a heating oven together with the long lead wire for the purpose of subjecting a resin material for molding the fly-back transformer heat curing. Unfortunately, the long lead wire renders the operation highly troublesome and and deteriorates production efficiency.

In order to solve the problem, the assignee proposed a terminal connection structure for connecting a core of a lead wire to a connection electrode of a circuit board without soldering, as suggested in Japanese Utility Model Application No. 87639/1992 and U.S. patent application Ser. No. 158,943 corresponding thereto. The terminal connection structure is constructed in such a manner as shown in FIG. 9. More specifically, in FIG. 9, reference numeral 101 designates a circuit board on which a resistance circuit pattern and a plurality of connection electrodes are provided. The circuit board is received in a board receiving section of an insulating casing 102 made of insulating resin. The substrate receiving section of the insulating casing 102 is provided on an inner periphery thereof with a board fixing rib 103 for supporting the circuit board 101 in a manner to form a space between a front surface of the circuit board and an inner surface of the insulating casing 102. The circuit board 101 is adhered to the rib 103. The insulating casing 102 is formed therein with a terminal fitment fit section 104, in which a terminal fitment 105 and a conductive rubber member 106 are received. The conductive rubber member 104 functions as a connection means for connecting a connection electrode 107 arranged on the circuit board 101 and the terminal fitment 105 to each other without soldering. The terminal fitment 105 includes a connection conductor holding section 105b provided with a plurality of edges 105a which are adapted to bite into an outer periphery of an end of a core of a lead wire 109 inserted into the insulating casing 102 via a through-hole 108 of the casing 102. The terminal fitment 105 further includes four walls 105c arranged on sides of the connection conductor holding section 105b so as to extend in a direction of insertion of the lead wire 109 perpendicular to the connection conductor holding section 105b, respectively. Of four such walls 105c, the wall 105 contacted with the conductive rubber member 106 is provided on an outer surface thereof with a projection 105d, which is then inserted into a through-hole 106a of the conductive rubber member 106.

As will be noted from the foregoing, the proposed terminal connection structure thus constructed requires the conductive rubber member 106 in addition to the terminal fitment 105, to thereby increase both the number of parts required for the structure and the number of steps required for the assembling. Also, the conductive rubber member is relatively expensive, leading to an increase in cost of an electronic component or a high-voltage electronic component such as a high-voltage variable resistor or the like.

A structure for connecting the connection conductor and the terminal fitment to each other is disclosed by way of example in Japanese Utility Model Application Laid-Open publication No. 192601/1987 and U.S. Pat. No. 4,834,603 and the like.

SUMMARY OF THE INVENTION

The present invention has been made in view of the foregoing disadvantage of the prior art.

Accordingly, it is an object of the present invention to provide an electronic component which is capable of permitting a terminal fitment and a connection electrode provided on a circuit board to be electrically connected to each other without soldering.

It is another object of the present invention to provide an electronic component which is capable of having a terminal fitment incorporated therein while keeping a structure of the terminal fitment simplified.

It is a further object of the present invention to provide an electronic component which has a terminal fitment integrally provided with a contact terminal section contacted with a connection electrode provided on a circuit board.

It is still another object of the present invention to provide an electronic component which is capable of ensuring electric connection between a contact terminal section and a connection electrode in a circuit board without any conductive rubber member.

It is yet another object of the present invention to provide an electronic component which is capable of ensuring positive contact of a contact terminal section with a connection electrode provided on a circuit board.

It is even another object of the present invention to provide an electronic component which is capable of providing a contact terminal section with sufficient elasticity.

It is a still further object of the present invention to provide an electronic component which is capable of positively holding a terminal fitment while simplifying a structure thereof.

It is a yet further object of the present invention to provide an electronic component which is capable of permitting insertion of a fitment thereinto to be readily automated.

It is an even further object of the present invention to provide an electronic component which is capable of eliminating a necessity of soldering for connection.

It is another object of the present invention to provide an electronic component which is capable of being decreased in manufacturing cost.

In accordance with the present invention, an electronic component is provided. The electronic component includes an insulating casing provided therein with a board receiving section of which one end is open, a circuit board having a circuit pattern including a plurality of connection electrodes formed on a front surface thereof and received in the board receiving section of the insulating casing to define a space between an inner surface of the insulating casing and the front surface of the circuit board, and at least one terminal fitment arranged between the front surface of the circuit board and the inner surface of the insulating casing and electrically connected to at lease one of the connection electrodes on the circuit board without soldering. The insulating casing is provided therein with at least one terminal fitment fit portion in which the terminal fitment is fitted. The terminal fitment includes a connection conductor holding section for holding an end of a connection conductor inserted into the board receiving section and a contact terminal section exhibiting elasticity. The contact terminal section includes a contact portion pressed against the connection electrodes on the circuit board by the elasticity of the contact terminal section.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIG. 5(A) is a left side elevation view showing a terminal conductor;

FIG. 5(B) is a front elevation view of the terminal conductor shown in FIG. 5(A);

FIG. 5(C) is a right side elevation view of the terminal conductor shown in FIG. 5(A);

FIG. 5(D) is a bottom view of the terminal conductor shown in FIG. 5(A);

FIG. 6(A) is an enlarged schematic view showing a terminal conductor fit section and a periphery thereof;

FIG. 6(B) is a sectional view taken along line B—B of FIG. 6(A);

FIG. 6(C) is a sectional view taken along line C—C of FIG. 6(A);

DETAILED DESCRIPTION OF THE PREFERRED EMBODIMENTS

Figure 1A:
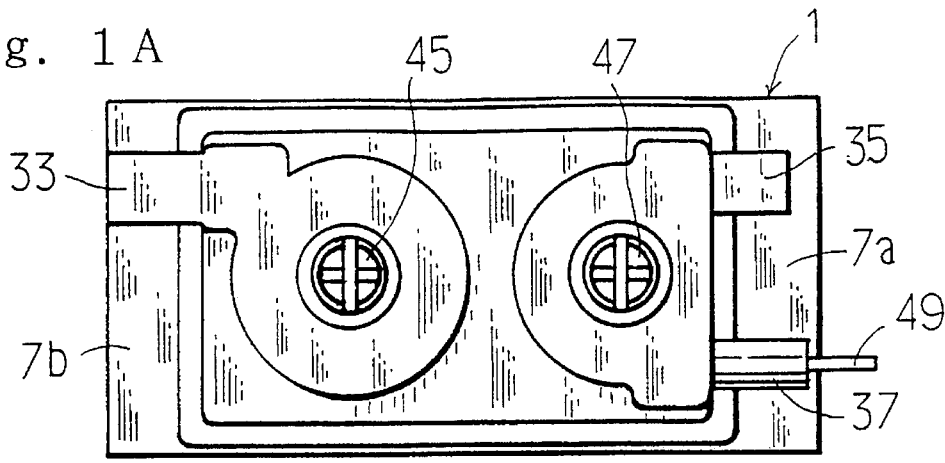
FIG. 1(A) is a plan view showing an embodiment of an electronic component according to the present invention which is in the form of a high-voltage variable resistor.
Figure 1B:
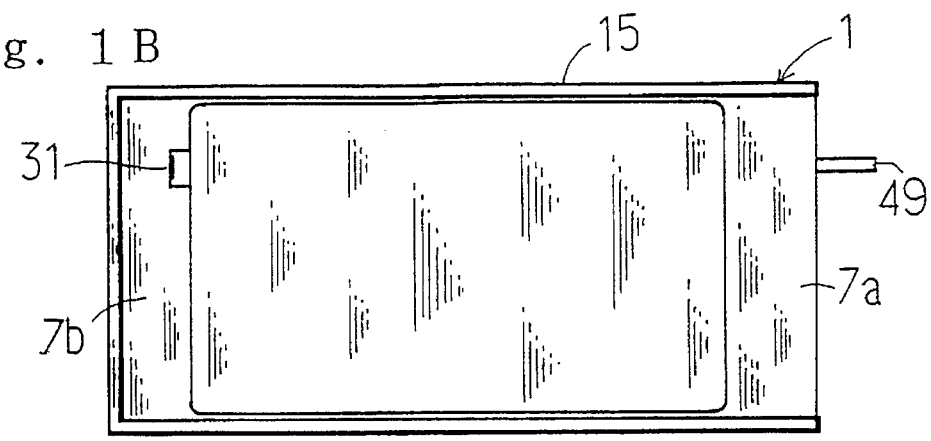
FIG. 1(B) is a bottom view of the high-voltage variable resistor of FIG. 1(A)
Figure 1C:
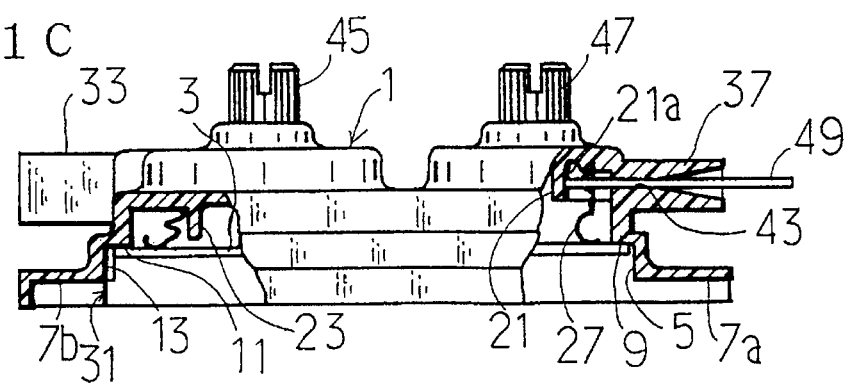
FIG. 1(C) is a partly broken right side elevation view of the high-voltage variable resistor of FIG. 1(A)
Figure 1D:
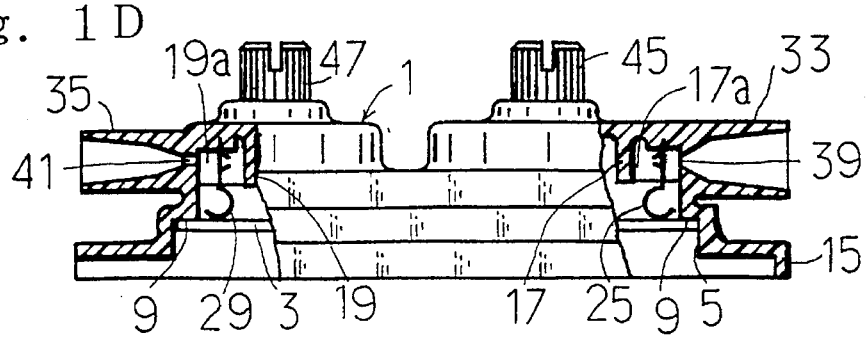
FIG. 1(D) is a partly broken left side elevation view of the high-voltage variable resistor.

Now, an electronic component according to the present invention will be described hereinafter with reference to the accompanying drawings.

Referring first to FIGS. 1(A) to 2(B), an embodiment of an electronic component according to the present invention is illustrated, which is in the form of a high-voltage variable resistor. A high-voltage variable resistor of the illustrated embodiment is adapted to adjust a focus voltage of a CRT and a screen voltage thereof and generally called a focus pack. The high-voltage variable resistor of the illustrated embodiment includes an insulating casing 1 integrally formed of an insulating resin material such as Noryl (trademark), polybutylene terephthalate or the like. The resistor also includes a circuit board 3 made of a ceramic material and formed thereon with a circuit pattern including an input electrode E1, a focus voltage output electrode E2, a screen voltage output electrode E3, a ground electrode E4, a focus voltage adjusting resistance element R1, a screen voltage adjusting resistance element R2 and additional low resistance elements.

The insulating casing 1 is open at a lower side end and provided therein with a board receiving section 5. Also, the insulating casing 1 is provided at both ends thereof defined in a longitudinal direction thereof with a plate-like portions 7a and 7b, respectively. Further, the insulating casing 1 is formed on a substantially whole inner periphery thereof with a board fixing rib 9 for holding a circuit board 3 thereon. The rib 9 is formed with a first conductor lead-out groove 11 in which a terminal conductor constituting a ground terminal is partially fitted. The insulating casing 1 is formed on an inner surface thereof defining the board receiving section 5 with a second conductor lead-out groove 13 in correspondence to the first groove 11. The circuit board 3 is joined to the rib 9 by means of a silicone resin adhesive or an epoxy resin adhesive. Reference numeral 15 designates an opening-side or lower peripheral wall portion forming an opening-side lower portion of the insulating casing 1, which is fitted in a fit groove formed in a fly-back transformer casing.

The insulating casing 1 is integrally provided on a wall portion thereof defining the board receiving section 5 with three terminal fitment fit portions 17, 19 and 21 and one terminal conductor fit portion 23, which will be detailedly described hereinafter. The terminal fitment fit portions 17, 19 and 21 have terminal fitments 25, 27 and 29 which are provided in correspondence to the focus voltage output electrode E2, screen voltage output electrode E4 and ground electrode E3 fitted therein, respectively. The terminal conductor fit portion 23 has a contact terminal portion of a terminal conductor 31 which is provided in correspondence to the input electrode E1 fitted therein. The terminal fitments and terminal conductors will be detailedly described hereinafter.

The insulating casing 1 is integrally formed on an outer surface thereof with connection conductor insertion cylinders 33, 35, and 37 into which a pin terminal, a lead wire or the like is inserted in correspondence to the terminal fitment fit portions 17, 19 and 21, respectively. The connection conductor insertion cylinders 33, 35 and 37 are formed at a bottom thereof with through-holes 39, 41 and 43, respectively. A space which has a size sufficient to receive two slide elements (not shown) therein is formed between an inner surface of the insulating casing 1 and a front surface of the circuit board 3. Reference numerals 45 and 47 each designate an operation shaft extending through an upper wall of the insulating casing 1 into the casing 1 so as to operate the operation shaft from an outside of the insulating casing 1. 49 is a connection conductor comprising a pin terminal constituting a ground terminal.

The high-voltage variable resistor of the illustrated embodiment is mounted on a side surface of a transformer casing of the fly-back transformer. In the illustrated embodiment, the circuit board 3 is not formed with no holes, resulting in exhibiting increased mechanical strength. This permits rigid epoxy resin for molding which is charged in the casing of the fly-back transformer to be charged directly on a side of a rear surface of the circuit board 3. In this instance, the rear surface of the circuit board 3 may be covered with a film of the epoxy resin. Of course, the rear surface of the circuit board 3 may be formed thereon with an insulating layer of flexible resin.

Figure 3A:
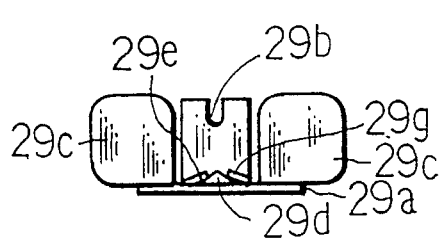
FIG. 3(A) is a plan view showing a terminal fitment.

The terminal fitments 25, 29 and 27 received in the terminal fitment fit portions 17, 19 and 21 each are formed by bending a conductive metal plate made of stainless steel, bronze or the like and cut into a predetermined shape. The terminal fitments thus formed each are adapted to be connected to a connection conductor without soldering. The conductive metal plate is preferably subject to bending so as to exhibit elasticity to a certain degree. For this purpose, a SUS 301 stainless steel plate of 0.1 to 0.4 mm in thickness, a bronze plate of 0.2 to 0.5 mm in thickness or the like may be used by way of example. The terminal fitments 25, 29 and 27 are formed into the same configuration, therefore, the following description will be made on the terminal fitment 29. FIG. 3(A) is a plan view of the terminal fitment 29, FIG. 5(B) is a front elevation view of the terminal fitment 29 and FIG. 5(C) is a right side elevation view of the terminal fitment 29. The terminal fitment 29 includes a plate-like section 29a formed with a connection conductor holding portion for holding the connection conductor, a contact terminal section 29b formed by bending a strip-like portion integrally extending from the plate-like section 29a and a flat-plate section 29c having a surface extending in a direction intersecting a surface of the plate-like section 29a.

The plate-like section 29a is formed into a substantially rectangular configuration and provided with four slits S1 to S4 in a manner to radially extend from a center thereof toward corners thereof, respectively. Between the slits adjacent to each other are defined four triangular edge portions 29d to 29g adapted to bite into an outer peripheral surface of the connection conductor inserted through the plate-like section 29a into the insulating casing. The edge portions 29d to 29g are formed so as to be oblique in a direction of insertion of the connection conductor through the plate-like section 29a. An angle at which each of the edge portions is oblique is so determined that an interval between two adjacent edge portions 29d and 29f or two adjacent edge portions 29e and 29g is smaller than a diameter of the connection conductor inserted through a space between the slits. Such oblique arrangement of the edge portions permits the connection conductor to be guided along a center of the space, to thereby facilitate insertion of the connection conductor through the space. However, such oblique arrangement of the edge portions is not necessarily required so long as the connection conductor exhibits hardness increased to a degree sufficient to permit the connection conductor to be inserted through the plate-like section 29a while rendering the edge portions oblique. The edge portions 29d to 29g each are formed with a pointed distal end, resulting in readily biting into the connection conductor to prevent release or dislocation of the connection conductor from the terminal fitment 29 when force in a direction of drawing the connection conductor out of the terminal fitment is applied to the connection conductor. Such biting of the four edge portions into the connection conductor in four directions effectively prevents the connection conductor from being released from the terminal fitment 29 even when force in a direction of drawing the connection conductor out of the plate-like section 29a is applied obliquely thereto.

The contact terminal section 29b may be formed into any desired shape. In this connection, it may be preferably formed into a configuration which permits a contact of the contact terminal section 29b to be hard to slide on the front surface of the circuit board 3 when it is interposedly arranged between the insulating casing 1 and the circuit board 3. Most preferably, the contact terminal section 29b is pressed against the circuit board 3 to a degree sufficient to fully prevent the contact from sliding on the circuit board.

In the illustrated embodiment, the contact terminal section 29b is formed by bending the strip-like portion in order to provide the strip-like portion with elasticity and includes a base portion positioned on a side of the plate-like section 29a and including a straight portion 29b1. The straight portion 29b1 is provided for adjusting the height, therefore, it may be eliminated as required. Also, the contact terminal section 29b includes a curved portion 29b2 contiguous to the straight portion 29b1 and a contact portion 29b3 formed at a distal end of the curved portion 29b2 by curling. Such curling for curving the other or distal end of the strip-like portion into a small radius permits the contact portion to be free of any edge, so that some sliding of the contact of the contact terminal section on the connection electrode on the circuit board does not cause peeling of the connection electrode.

The curved portion 29b2 is formed so as to prevent any distinct fold or bending from being formed at an intermediate portion thereof. Formation of such fold or bending generally increases deformation of the curved portion 29b2 to increase sliding of the contract portion 29b3 on the circuit board 3, resulting in the contact portion 29b3 being released from the connection electrode on the circuit board 3.

Adjustment of elasticity or elastic force of the contact terminal section 29b is limited, although it may be carried out to a certain degree depending on a material therefor and a configuration of bending thereof. In the illustrated embodiment, in order to ensure that elasticity of the contact terminal section is adjusted as desired, the curved portion 29b2 is formed with a single slit 29b4 in a manner to inwardly extend in a longitudinal direction thereof from the distal end thereof. The slit 29b4 is provided for finely adjusting elasticity of the curved portion 29b2 and providing the contact with a multi-contact function. Such arrangement of the slit 29b4 permits elasticity of the contact terminal section 29b to be finely adjusted without substantially changing the material and a configuration of the bending. The elasticity may be varied depending on a width of the slit 29b4 and a length thereof. In the illustrated embodiment, the slit 29b4 is formed through the curved portion 29b2 in a direction of a thickness thereof. However, a direction in which the slit is formed and the number of such slits are not limited to those in the illustrated embodiment. For example, formation of the slit in a manner to extend to a distal end of the contact terminal section 29b permits each of portions of the contact terminal section on both sides of the slit to act as a contact portion, resulting in the contact terminal section exhibiting a multi-contact function.

When the terminal fitment 29 is to be fixed in the insulating casing 1 by being merely fitted in the terminal fitment fit portion 21, it is impossible to carry out the fitting while keeping the terminal fitment 29 at a predetermined posture. In particular, automatic assembling of the resistor requires to loosely fit the terminal fitment 29 in the terminal fitment fit portion 21 or form the terminal fitment fit portion into a somewhat increased size, leading to a failure to fit the terminal fitment 29 in the terminal fitment fit portion 21 at a predetermined or desired posture. If the terminal fitment 29 is positioned in the terminal fitment fit portion 21 while being kept somewhat inclined, an area of contact between the contact terminal section 29b and the connection electrode on the circuit board 3 is highly reduced. Such a problem is effectively solved by constructing the contact terminal section 29b so as to permit it to exhibit such a multi-contact function as described above.

The flat-plate section 29c is provided at an end of the plate-like section 29a positioned on a side of the contact terminals section 29b and the surface of the flat-like section 29c, as described above, is defined so as to extend in a direction perpendicular to the surface of the plate-like section 29a. The flat-plate section 29c may act as a suction portion when it is automatically inserted into the fit portion 21 by means of an automatic insertion device. Arrangement of the flat-plate section 29c facilitates confirmation of a direction in which the terminal fitment 29 should be inserted into the terminal fitment fit portion 21. In particular, when the fit groove 21b is provided on a periphery thereof with an abutment against which the flat-plate section 29c is abutted, the flat-plate section 29c is permitted to function as a mechanical reinforcement for reinforcing the plate-like section 29a.

Now, the terminal fitment fit portions 17, 19 and 21 will be described with reference to FIG. 2.

Figure 2A:
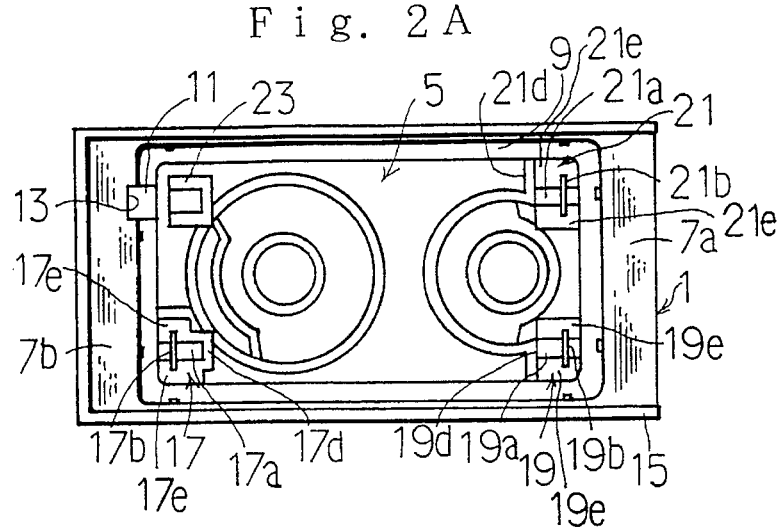
FIG. 2(A) is a bottom view showing an insulating casing.
Figure 2B:
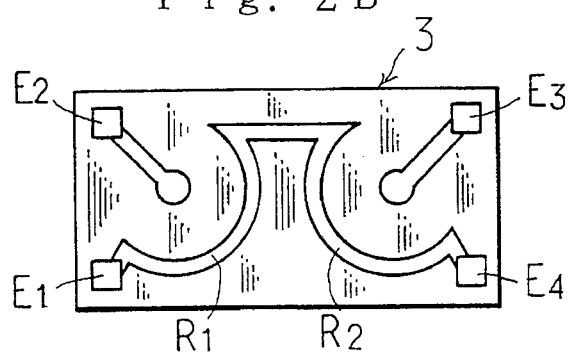
FIG. 2(B) is a schematic plan view showing a circuit board.

The terminal fitment fit portions 17, 19 and 21 each are formed at a corner of the insulating casing 1 so as to extend from an inner bottom surface of the insulating casing 1 or an inner top surface thereof toward the circuit board 3. The terminal fitment fit portions 17, 19 and 21 are formed with connection conductor insertion spaces 17a, 19a and 21a communicating with through-holes 39, 41 and 43 (FIGS. 1(C) and 1(D)) formed through a side wall of the insulating casing 1, respectively. The connection conductor insertion spaces 17a, 19a and 21a, as shown in FIG. 2(A), each are open on a side of the opening of the insulating casing 1 or a side of the circuit board 3. The connection conductor insertion spaces 17a, 19a and 21a may comprise extensions of the through-holes 39, 41 and 43, respectively. Also, the terminal fitment fit portions 17, 19 and 21 are formed with fit grooves 17b, 19b and 21b in a manner to be perpendicular to the connection conductor insertion spaces 17a, 19a and 21a, respectively. In the illustrated embodiment, the fit grooves 17b, 19b and 21b each are formed so as to be open toward the connection conductor insertion space and circuit board and support sides of the plate-like section 29a other than a side thereof on which the contact terminal section is provided. Such construction permits the plate-like section 29a to be firmly held without reinforcing it.

Wall members 17d, 19d and 21d each defining an inner end of each of the connection conductor insertion spaces 17a, 19a and 21a each constitute a stopper wall against which an end of the connection conductor is abutted. The stopper wall is abutted at an end thereof facing the opening of the insulating casing 1 or the circuit board 3 against the flat-plate section 29c of the terminal fitment 29 (see FIG. 4(A)). Such abutment prevents the terminal fitment from being excessively pressed against each of the fit grooves 17b, 19b and 21b, to thereby prevent deformation of the plate-like section 29a due to application of excessive force to the terminal fitment 29.

Figure 4A:
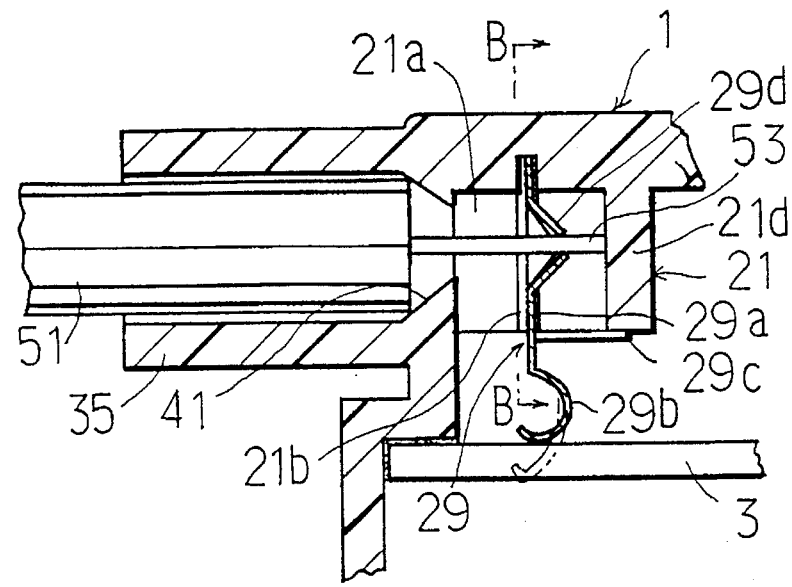
FIG. 4(A) is an enlarged sectional view showing a screen output section.
Figure 4B:
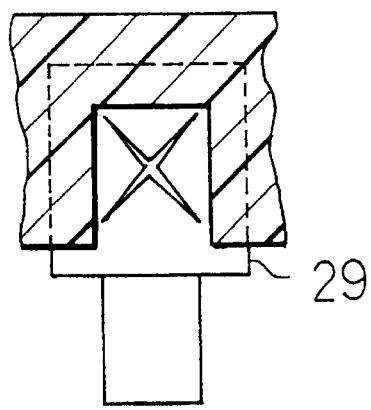
FIG. 4(B) is a sectional view taken along line B—B of FIG. 4(A)
Figure 4C:
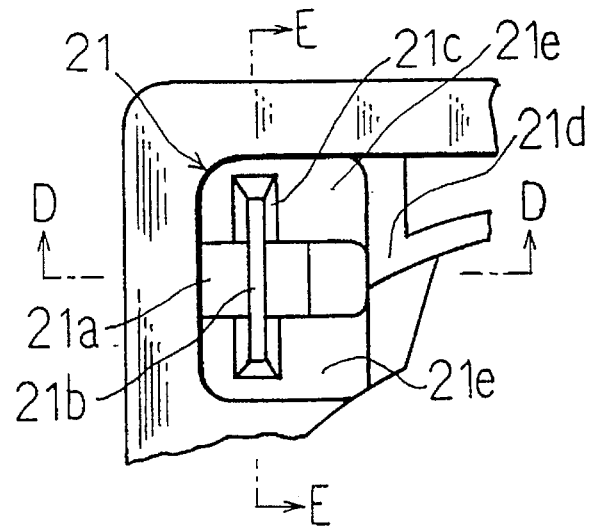
FIG. 4(C) is an enlarged plan view showing a terminal fitment fit section.
Figure 4D:
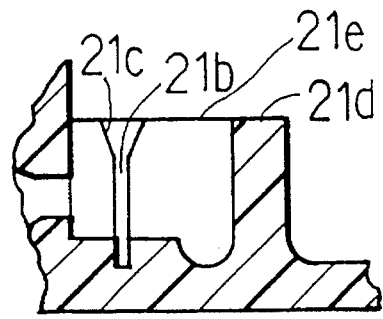
FIG. 4(D) is a sectional view taken along line D—D of FIG. 4(C)
Figure 4E:
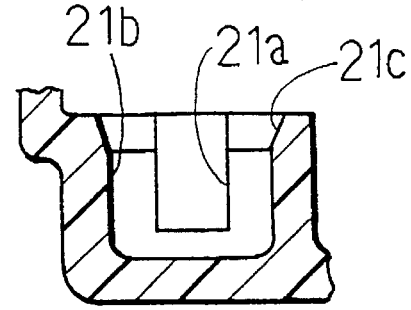
FIG. 4(E) is a sectional view taken along line E—E of FIG. 4(C)

The terminal fitment fit portions 17, 19 and 21 are constructed in substantially the same manner. The following description will be made on the terminal fitment fit section 21 with reference to FIG. 4, wherein FIG. 4(A) is an enlarged sectional view of a screen output portion, FIG. 4(B) is a sectional view taken along line B—B of FIG. 4(A), FIG. 4(C) is an enlarged plan view of the terminal fitment fit portion, FIG. 4(D) is a sectional view taken along line D—D of FIG. 4(C) and FIG. 4(E) is a sectional view taken along line E—E of FIG. 4(C). The fit groove 21b is formed into a width which permits the terminal fitment 29 to drop from the fit groove 21 when the insulating casing 1 is placed while keeping the opening of the insulating casing 1 facing down. This is for the reason that the terminal fitment 29 is permitted to be automatically inserted into the fit groove 21b by means of an automatic insertion device while keeping the opening of the insulating casing 1 facing up. In the illustrated embodiment, the fit groove 21b is formed at an upper open end thereof with a taper 21c which permits the open end to be upwardly enlarged. The taper 21c facilitates automatic insertion of the terminal fitment 29.

Figure 3B:
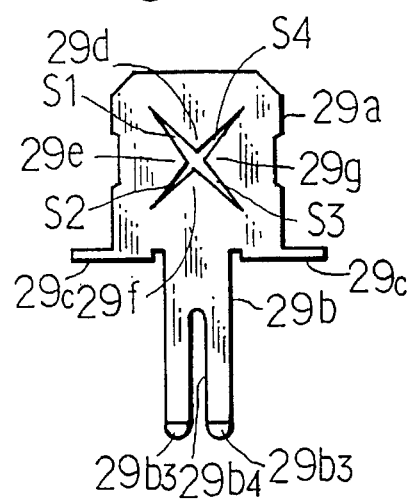
FIG. 3(B) is a front elevation view of the terminal fitment of FIG. 3(A)
Figure 3C:
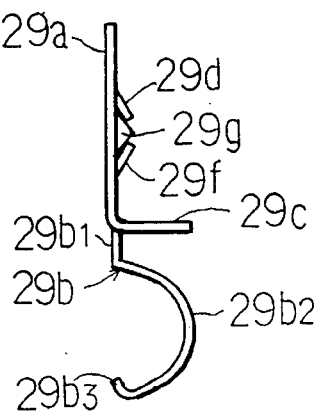
FIG. 3(C) is a right side elevation view of the terminal fitment of FIG. 3(A)

Now, the terminal conductor 31 constituting an input terminal and mounting of the terminal conductor 31 will be described with reference to FIGS. 5 and 6, wherein FIGS. 5(A) to 5(D) are a left side elevation view of the terminal conductor 31, a front elevation view thereof, a right side elevation view thereof and a bottom view thereof, respectively, FIG. 6(A) is an enlarged view of the terminal conductor fit portion 23 and a periphery thereof, FIG. 6(B) is a sectional view taken along line B—B of FIG. 6(A) and FIG. 6(C) is a sectional view taken along line C—C of FIG. 6(A). The terminal conductor 31 is formed by subjecting a conductive metal plate to machining as in the terminal fitments 25, 27 and 29. The terminal conductor 31 includes an elastic contact terminal section 31a interposedly arranged or supported between the front surface of the circuit board 3 and the inner surface of the insulating casing 1 and contacted with the connection electrode E1 (FIG. 2(B)), an intermediate section 31b contiguous to the contact terminal section 31a and an input terminal section 31c contiguous to the intermediate section 31b. The contact terminal section 31a includes a curved portion 31a1 formed into an S-like shape to provide the contact terminal section 31a with elasticity and an L-shaped support portion or interposed portion 31a2. The curved portion 31a11 is provided at a distal end thereof with a contact 31a11, which is formed by curling. In the illustrated embodiment, the curved portion 31a1 is formed so as to prevent any distinct fold or bending from being formed at an intermediate region thereof. The curved portion 31a1 may be formed into any desired configuration, so long as it may be compressed in a direction of height of the insulating casing 1 or in a direction of thickness of the circuit board 3 when it is interposed between the insulating casing 1 and the circuit board 3. The curved portion 31a1 is formed with a single slit 31a12 in a manner to inwardly extend in a longitudinal direction thereof from the distal end thereof. The slit 31a12 is provided for finely adjusting elasticity of the curved portion 31a1 and providing the contact with a multi-contact function, like the slit 29b4 of the terminal fitment 29 shown in FIG. 3.

The curved portion 31a1 and a part of the L-shaped interposed portion 31a2 are fitted in the terminal conductor fit portion 23. The terminal conductor fit portion 23, as shown in FIG. 6, includes three wall 23a to 23c arranged so as to extend from the upper wall of the insulating casing 1 toward the opening. The wall 23a to 23c are arranged so as to form a fit recess 23d which is open toward the plate-like portion 7b of the insulating casing 1 and the opening thereof. In the fit recess 23d is loosely fitted a part 31a21 of the interposed portion 31a2 of the terminal conductor 31 in order to accomplish automatic insertion. The walls 23a to 23c are formed at an end thereof with tapers 23a1 to 23c1 in order to facilitate automatic insertion of the terminal conductor 31. The interposed portion 31a2 of the terminal conductor 31 is interposedly supported at a part 31a22 thereof between the ,insulating casing 1 and the front surface of the circuit board 3.

The intermediate section 31b of the terminal conductor 31 includes a portion 31b1 arranged between the first conductor lead-out groove 11 formed at the rib 9 and the front surface of the circuit board 3 and a portion 31b2 extending toward the rear surface of the circuit board 3 through a space between the second conductor lead-out groove 13 formed on an inner surface of the insulating casing 1 so as to be contiguous to the first conductor lead-out groove 11 and an end surface of the circuit board 3. The portion 31b1 of the intermediate section 31b is formed with a through-hole 31d acting as an adhesive flow passage through which an adhesive flows. The adhesive flow passage 31d is formed in a longitudinal direction of the intermediate section 31b. The adhesive flow passage 31d is provided in order to introduce an adhesive for adhesion of the circuit board to the rib 9 thereinto to avoid formation of a gap between the portion 31b1 of the intermediate section 31b and the first conductor lead-out groove 11 when the adhesive is applied to the rib 9 for adhesion of the circuit board thereto. Formation of such a gap, when flexible insulating resin is charged on a side of the rear surface of the circuit board 3 or rigid molding resin for the fly-back transformer is charged directly on the side of the rear surface of the circuit board 3, causes the resin to flow through the gap onto the front surface of the circuit board. The portion 31b2 of the intermediate section 31b is provided with an expansion 31e, which functions to provide the terminal section with increased mechanical strength. The first and second conductor lead-out grooves 11 and 13 are formed into a width W1 larger than a width of the intermediate section 31b of the terminal conductor 31 and a width W2 of the fit recess 23d of the terminal conductor fit portion 23. Formation of the grooves 11 and 13 into such a width permits the intermediate section 31b to be positively fitted in the first and second conductor lead-out grooves 11 and 13 even when the terminal conductor 31 is inserted into the terminal conductor fit portion 23 by means of an automatic insertion device. A decrease in width W1 fails to permit the intermediate section 31b to fully enter the grooves 11 and 13, so that the automatic assembling is disadvantageously carried out while keeping the terminal inclined. Thus, it will be noted that the width set as described above leads to an improvement in yield of the product.

The terminal section 31c of the terminal conductor 31 is formed with a through-hole 31f. Into the through-hole 31f is inserted a core of a lead wire extending from the fly-back transformer, so that the core is wound on the terminal section 31c. This permits the core of the lead wire extending from the fly-back transformer to be connected to the terminal conductor without soldering.

The terminal conductor 31 permits the contact terminal section 31a to electrically connect the terminal conductor arranged on the rear surface of the circuit board 3 to the contact electrode E1 arranged on the front surface of the circuit board 3 without soldering. Also, the terminal conductor 31 permits it to be arranged thereon without forming the circuit board 3 with any hole. In particular, when the circuit board 3 is made of a ceramic material or the like, such a hole substantially affects mechanical strength of the circuit board. An increase in mechanical strength of the circuit board 3 prevents breakage of the circuit board even when resin such as molding resin for the fly-back transformer is charged directly on the side of the rear surface of the circuit board 3 without forming any flexible insulating layer on the rear surface of the circuit board 3.

Figure 9:
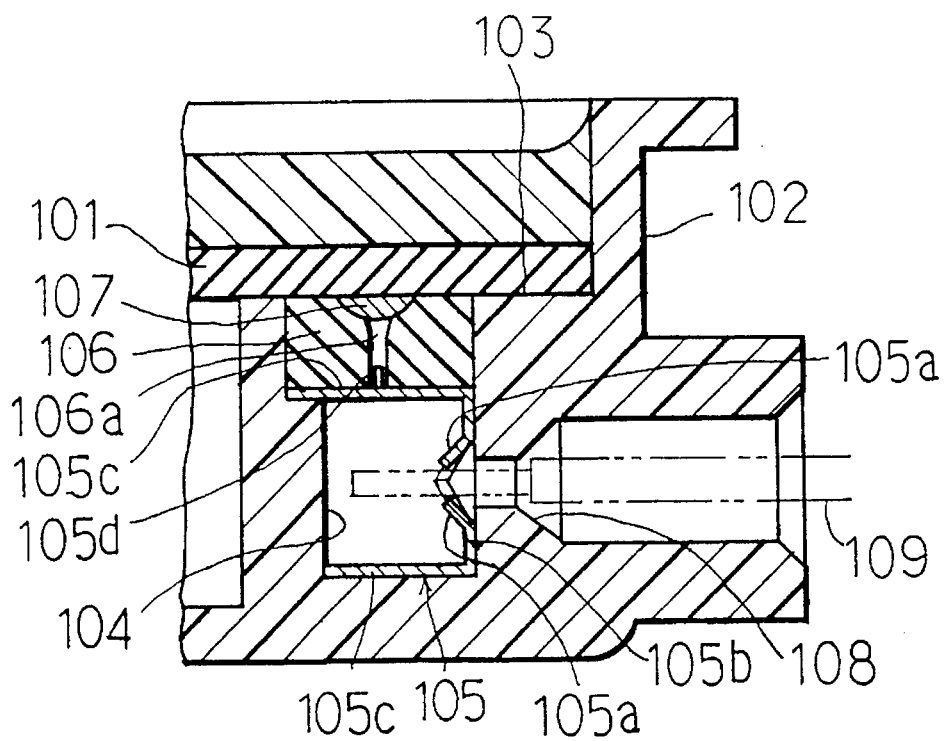
FIG. 9 is a sectional view showing a terminal structure of a conventional high-voltage electronic component proposed by the assignee.

In the illustrated embodiment, the terminal fitments 25, 27 and 29 are arranged for the connection electrodes E2, E3 and E4, respectively. However, it is not required to arrange terminal fitments of the same configuration for all the electrodes. Alternatively, such a connection structure using a conductive rubber member as shown in FIG. 9 may be used for any of the connection electrodes. Also, when soldering is required from design and dimensional viewpoints, any of the connection electrodes may be connected to any of the connection conductors by soldering.

Figure 7:
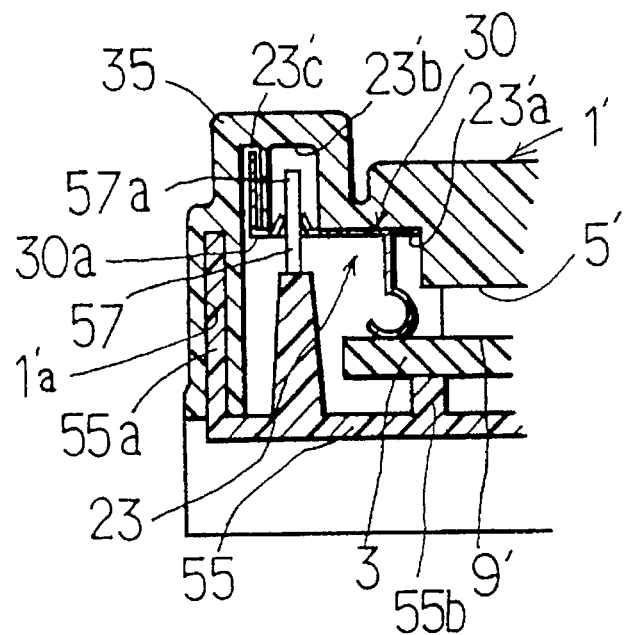
FIG. 7 is an enlarged sectional view showing an essential part of another embodiment of an electronic component according to the present invention, which is in the form of a high-voltage variable resistor.

Referring now to FIG. 7, a modification of the embodiment described above is illustrated. In the modification, a board receiving section 5' of an insulating casing 1' is closed with a lid member 55. The insulating casing 1' is formed with a fit groove 1'a in which a wall 55a of the lid member 55 of a box-like shape is fitted. The lid member 55 is formed with a connection conductor 57 for input by insert molding. The connection conductor 57 is positioned at one end thereof on a side of a front surface of the lid member 55 or a side of the board receiving section 5' and at the other end thereof on a side of a rear surface of the lid member 55. The circuit board 3 is interposedly supported between a projection 55b formed on the front surface of the lid member 55 and a rib 9' of the insulating casing 1. A terminal fitment 30 functions to electrically connect one end 57a of the connection conductor 57 to an input electrode arranged on the circuit board 3 without soldering.

Figure 8A:
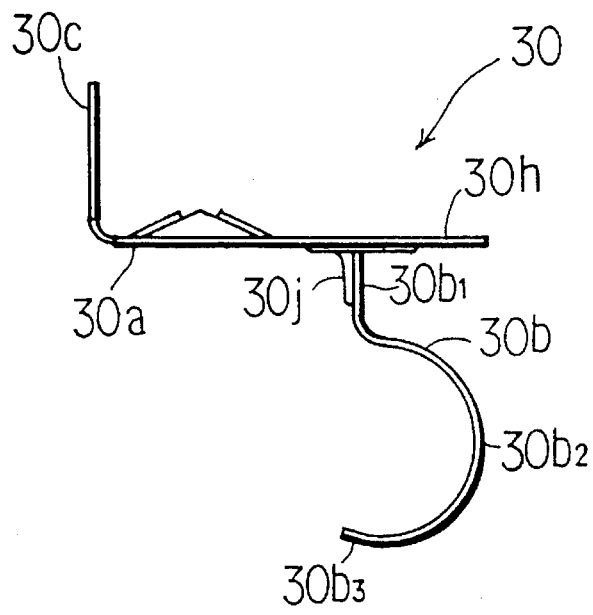
FIG. 8(A) is a front elevation view showing a terminal conductor.
Figure 8B:
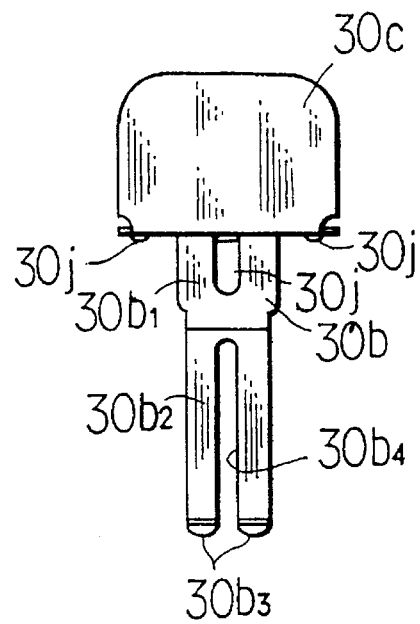
FIG. 8(B) is a left side elevation view of the terminal conductor shown in FIG. 8(A)
Figure 8C:
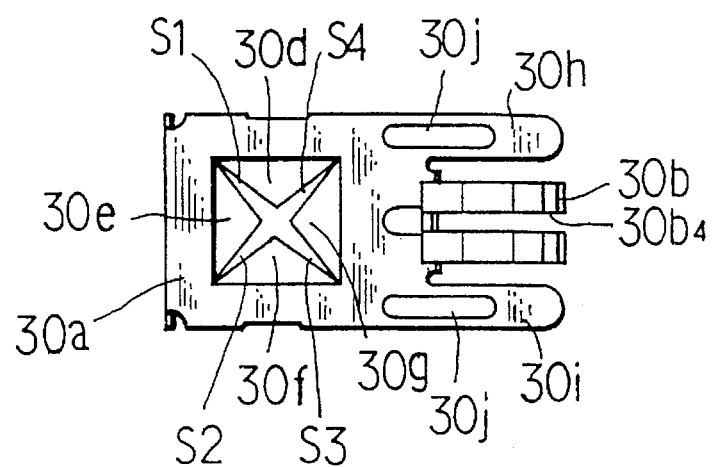
FIG. 8(C) is a bottom view of the terminal view shown in FIG. 8(A)

The terminal fitment 30 be constructed in such a manner as shown in FIGS. 8(A) to 8(C), wherein FIG. 8(A) is a front elevation view of the terminal fitment 30, FIG. 8(B) is a left side elevation view of the terminal fitment 30 and FIG. 8(C) is a bottom view of the terminal fitment 30. The terminal fitment 30 may be made of the same material as the terminal fitment 29 in the above-described embodiment. The terminal fitment 30 includes a plate-like section 30a formed with a connection conductor holding portion for holing a connection conductor, a contact terminal section 30b arranged so as to extend in a direction perpendicular to a surface of the plate-like section 30a or in a downward direction from one end of the plate-like section 30a, and a flat-plate section 30c arranged so as to extend in a direction perpendicular to the surface of the plate-like section 30a or in an upward direction from the other end of the plate-like section 30a. The plate-like section 30a is formed with four slits S1 to S4 in a manner to radially extend from a center thereof toward corners thereof. Between the slits adjacent to one another are defined four triangular edge portions 30d to 30g adapted to bite into an outer peripheral surface of the connection conductor inserted through the plate-like section 30a. The edge portions 30d to 30g are formed so as to be inclined in a direction of insertion of the connection conductor through the plate-like section 30a. The edge portions 30d to 30g each are provided with a pointed distal end, resulting in readily biting into the connection conductor to prevent release of the connection conductor from terminal fitment 30 when force in a direction of drawing the connection conductor out of the terminal fitment is applied to the connection conductor.

The contact terminal section 30b is formed by bending, resulting in being provided with elasticity. The contact terminal section 30b includes a base portion positioned on a side of the plate-like section 30a and including a straight portion 30b1. The straight portion 30b1 is provided for adjusting the height, therefore, it may be eliminated as desired. Also, the contact terminal section 30b includes a curved portion 30b2 contiguous to the straight portion 30b1 and a contact portion 30b3 formed at a distal end of the curved portion 30b2 by curling. The curved portion 30b2 is formed with a single slit 30b4 so as to inwardly extend in a longitudinal direction thereof from the distal end thereof. The slit 30b4 is provided for finely adjusting elasticity of the curved portion 30b2 and providing the contact with a multi-contact function. Also, the elasticity may be adjusted depending on a width of the slit 30b4 and a length thereof.

The plate-like section 30a is provided at an end thereof with a pair of reinforcing elements 30h and 30i so as to outwardly extend from the end. The reinforcing elements 30h and 30i function to prevent the plate-like section 30a from being substantially deflected when the connection conductor is inserted into the contact terminal section 30b. The reinforcing elements 30h and 30i and the straight portion 30b1 of the contact terminal section 30b each have an elongated expansion 30j formed by pressing, to thereby increase mechanical strength thereof.

The insulating casing 1 is provided with a terminal fitment fit portion 23', which includes a fit recess 23'a in which the plate-like section 30a of the terminal fitment 30 is loosely fitted, a conductor insertion recess 23'b into which an end 53a of a connection conductor 53 inserted into a connection conductor holding portion formed at the plate-like section 30a of the terminal fitment 30 is inserted, and a fit recess 23'c in which the flat plate section 30c of the terminal fitment 30 is fitted.

In the modification, the end 57a of the connection conductor 57 is inserted into the connection conductor holding portion of the terminal fitment 30 when the board receiving section 5' is covered with the lid member 55. Thus, the modification facilitates connection between the connection conductor for input and the terminal fitment.

The above description has been made in connection with the high-voltage variable resistor. However, it is a matter of course that the present invention can be effectively applied to any other electronic component.

As can be seen from the foregoing, the present invention is so constructed that the elastic contact terminal section provided at the terminal fitment is compressedly deformed between the circuit board and the insulating casing, resulting in the contact terminal portion forcing the contact against the connection electrode on the circuit board due to its elasticity. Such constriction ensures electrical connection between the terminal fitment and the connection electrode on the circuit board without using any conductive rubber. Also, arrangement of the elastic contact terminal in a manner to be integral with the terminal fitment decreases the number of parts required and facilitates assembling of the electronic component.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A high-voltage electronic component comprising:

a circuit board having a circuit pattern including a connection electrode provided on a front surface thereof;

an insulating casing made of insulating resin and provided therein with a board receiving section of which one end is open;

a board fixing rib for supporting said circuit board which is formed in said board receiving section so as to define a space between said front surface of said circuit board and an inner surface of said insulating casing; and a terminal conductor connected at one end thereof to said connection electrode on said circuit board and extending at the other end thereof to a side of a rear surface of said circuit board;

said terminal conductor being formed of a single conductive metal plate by working;

said one end of said terminal conductor being formed with an elastic contact terminal section which is interposedly supported between said front surface of said circuit board and said inner surface of said insulating casing and contacted with said connection electrode;

said terminal conductor including an intermediate section extending along an end surface of said circuit board to the side of said rear surface of said circuit board.

* * * * *